United States Patent
Zeng et al.

Patent Number: 6,137,139
Date of Patent: Oct. 24, 2000

[54] LOW VOLTAGE DUAL-WELL MOS DEVICE HAVING HIGH RUGGEDNESS, LOW ON-RESISTANCE, AND IMPROVED BODY DIODE REVERSE RECOVERY

[75] Inventors: Jun Zeng, Mountaintop; Carl Franklin Wheatley, Jr., Drums, both of Pa.

[73] Assignee: Intersil Corporation, Palm Bay, Fla.

[21] Appl. No.: 09/324,553

[22] Filed: Jun. 3, 1999

[51] Int. Cl.[7] .................................................. H01L 29/76
[52] U.S. Cl. .......................................... 257/342; 257/335
[58] Field of Search ..................................... 438/141, 156, 438/159, 212, 282; 257/335–343

[56] References Cited

U.S. PATENT DOCUMENTS

| | | | |
|---|---|---|---|
| 4,975,751 | 12/1990 | Beasom | 257/172 |
| 5,091,336 | 2/1992 | Beasom | 438/185 |
| 5,661,314 | 8/1997 | Merrill et al. | 257/144 |
| 5,757,033 | 5/1998 | Ajit | 257/120 |
| 5,925,910 | 7/1999 | Menegoli | 257/335 |

*Primary Examiner*—Brian Dutton
*Assistant Examiner*—William M. Brewster
*Attorney, Agent, or Firm*—Jaeckle Fleischmann & Mugel, LLP

[57] ABSTRACT

An improved low-voltage MOS device having high ruggedness, low on-resistance, and improved body diode reverse recovery characteristics comprises a semiconductor substrate on which is disposed a doped upper layer of a first conduction type. The upper layer includes at its upper surface a blanket implant of the first conduction type, a heavily doped source region of the first conduction type, and a heavily doped body region of a second and opposite conduction type. The upper layer further includes a doped first well region of the first conduction type and a doped well region of the second conduction type underlying the source and body regions. The first well region underlies the second well region and merges with the blanket implant to form a heavily doped neck region that abuts the second well region at the upper surface of the upper layer. A gate comprising a conductive material separated from the upper layer by an insulating layer is disposed on the upper layer overlying the heavily doped neck region. A process for forming an improved low-voltage MOS device having high ruggedness, low on-resistance, and improved body diode reverse recovery characteristics comprises providing a semiconductor substrate that includes a doped upper layer of a first conduction type, and implanting a blanket dopant of the first conduction type in an upper surface of the upper layer. A gate comprising a conductive material and an insulating layer is formed on the upper layer of the substrate, and a doped first well region of the first conduction type and a doped second well region of a second and opposite conduction type are formed by implanting dopants of first and second conduction types through a common window into the upper surface of the upper layer. The first well region underlies the second well region and merges with the blanket implant, forming a heavily doped neck region underlying the gate and abutting the second well region at the upper surface of the upper layer. A heavily doped source region of the first conduction type and a heavily doped body region of the second conduction type are formed in the second well region at the upper surface of the upper layer.

6 Claims, 6 Drawing Sheets

6,137,139

LOW VOLTAGE DUAL-WELL MOS DEVICE HAVING HIGH RUGGEDNESS, LOW ON-RESISTANCE, AND IMPROVED BODY DIODE REVERSE RECOVERY

FIELD OF THE INVENTION

The present invention relates to MOS devices and, more particularly, to a low voltage dual-well MOS device that is rugged and reliable, exhibits low on-resistance, and exhibits improved body diode reverse recovery characteristics.

BACKGROUND OF THE INVENTION

U.S. Pat. Nos. 4,975,751 and 5,091,336, the disclosures of which are incorporated herein by reference, describe high voltage component devices with low series resistance. However the recent proliferation of battery-powered, portable communication electronics has increased the need for low voltage, low on-resistance power MOSFETs for efficient power management. Furthermore, because such devices are frequently used in applications that involve inductive loads, it is desirable that they have high UIS (Unclamped Inductive Switching) capability. This is an extremely high stress process, during which the amount of avalanche energy absorbed by the device is expected to be as high as possible without resulting in catastrophic device failure. This capability is generally referred to as the device ruggedness. In addition, some applications such as synchronous rectifiers require that the body diode of a power MOSFET have a low reverse recovery charge.

Unfortunately, there is a conflict among device breakdown rating, on-resistance, improved UIS capability, and desirable body diode characteristics. There is a need for improved MOS devices that exhibit an optimum combination of these characteristics, a need that is met by the present invention.

SUMMARY OF THE INVENTION

The present invention is directed to an improved low-voltage MOS device having high ruggedness, low on-resistance, and improved body diode reverse recovery characteristics, and comprising a semiconductor substrate on which is disposed a doped upper layer of a first conduction type. The upper layer includes at its upper surface a blanket implant of the first conduction type, a heavily doped source region of the first conduction type, and a heavily doped body region of a second and opposite conduction type. The upper layer further includes a doped first well region of the first conduction type and a doped well region of the second conduction type underlying the source and body regions. The first well region underlies the second well region and merges with the blanket implant to form a more highly doped neck region that abuts the second well region at the upper surface of the upper layer. A gate comprising a conductive material separated from the upper layer by an insulating layer is disposed on the upper layer overlying the heavily doped neck region.

Further in accordance with the present invention is a process for forming an improved low-voltage MOS device having high ruggedness, low on-resistance, and improved body diod reverse recovery characteristics. The process comprises providing a semiconductor substrate that includes a doped upper layer of a first conduction type, and implanting a blanket dopant of the first conduction type in an upper surface of the upper layer. A gate comprising a conductive material and an insulating layer is formed on the upper layer of the substrate, and a doped first well region of the first conduction type and a doped second well region of a second and opposite conduction type are formed by implanting dopants of first and second conduction types through a common window into the upper surface of the upper layer. The first well region underlies the second well region and merges with the blanket implant, forming a more highly doped neck region that abuts the second well region at the upper surface of the upper layer underlying the gate. A heavily doped source region of the first conduction type and a heavily doped body region of the second conduction type are formed in the second well region at the upper surface of the upper layer.

DETAILED DESCRIPTION OF THE INVENTION

Figure 1:
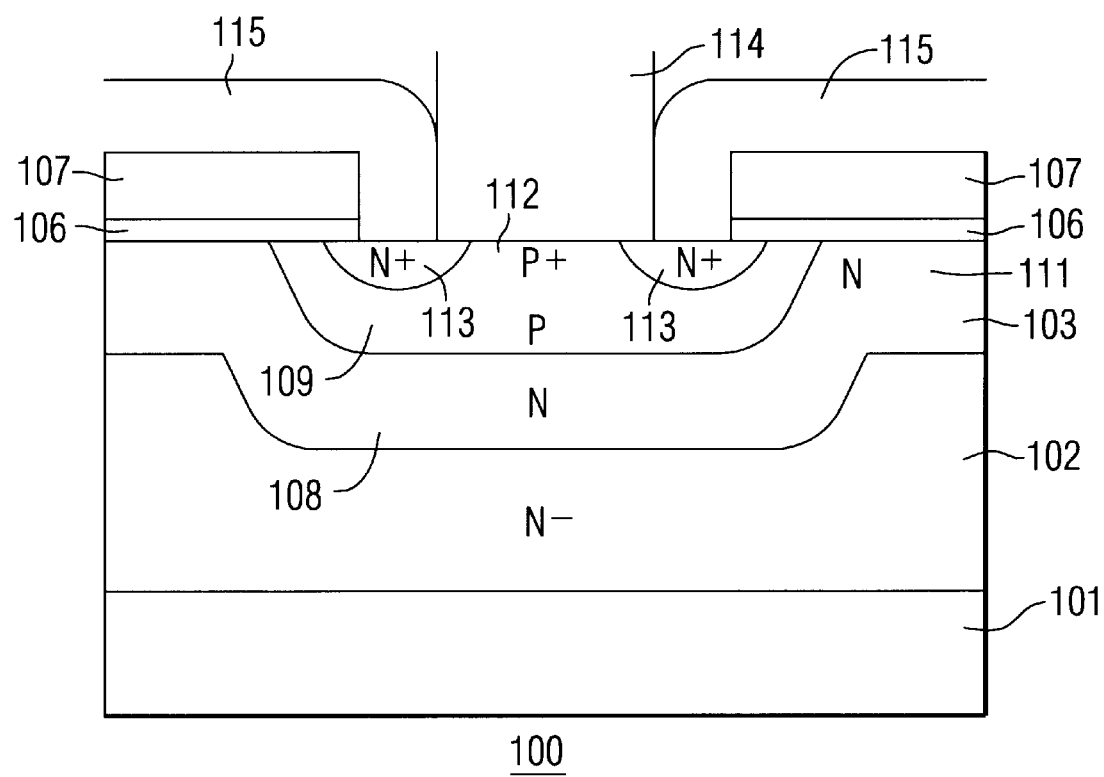
FIG. 1 is a schematic cross-section of a dual-well device of the present invention.
Figure 2A:
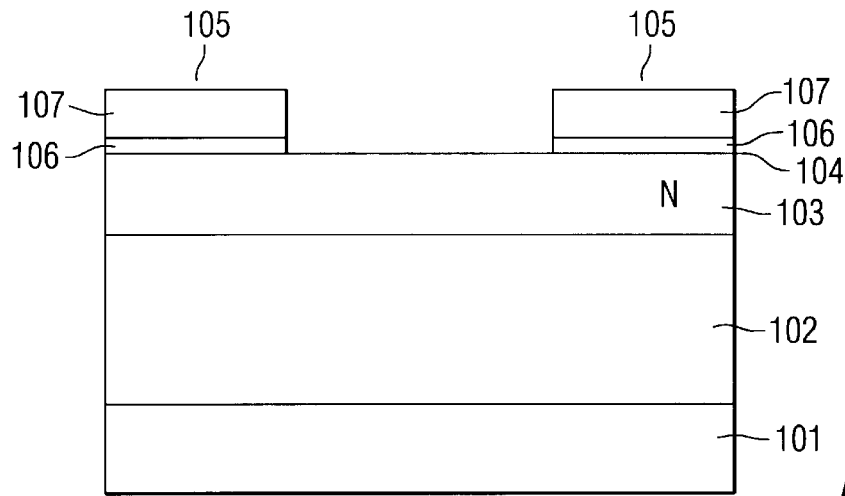
FIGS. 2A–C illustrate the process for forming a device of the invention.
Figure 2B:
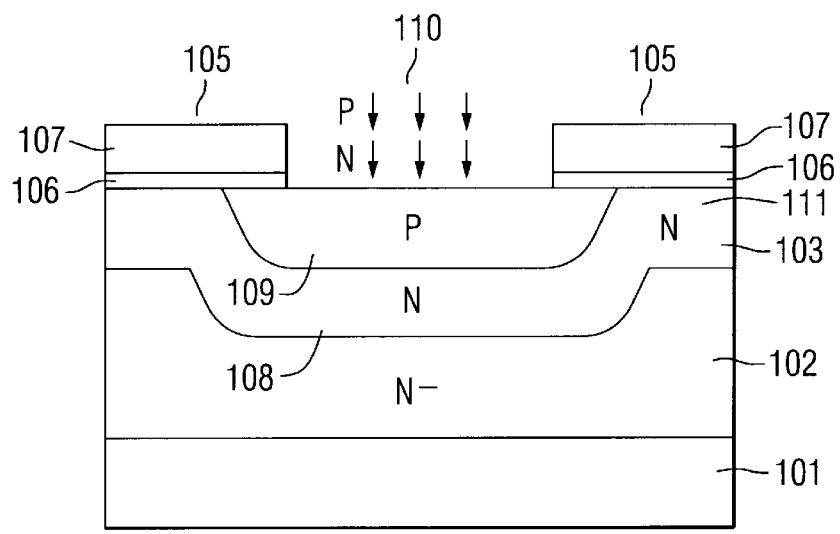
Figure 2C:
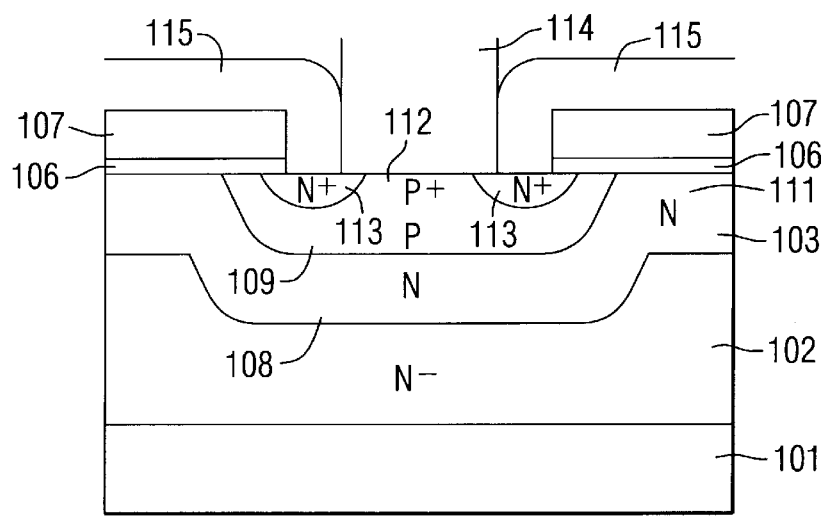

A low voltage MOS device 100 of the present invention, schematically depicted in FIG. 1, is formed by the process represented by FIGS. 2A–C. As shown in FIG. 2A, a semiconductor substrate 101 such as monocrystalline silicon having a lightly doped upper layer 102, which can be an epitaxial layer, is blanket implanted with an N-dopant 103. On the upper surface 104 of layer 102 is formed a gate 105 comprising an insulating layer 106, which can be silicon dioxide, and a conductive layer 107, highly doped polysilicon, for example.

As shown in FIG. 2B, first N-well 108 and then P-well 109 are formed by dopant implantation through common window 110. N-well 108, which is deeper than P-well 109, merges with previously implanted blanket dopant 103, resulting in a more highly doped N-neck region 111 in layer 102 under gate 105.

As depicted in FIG. 2C, heavily doped P+ body and N+ source regions 112 and 113, respectively, are implanted in P-well 109. It is to be recognized that the conduction types of the blanket, well, body, source, and substrate dopants can each be reversed, N for P and P for N. Deposition of a source metal contact 114 and an interlevel dielectric layer 115 completes the formation of device 100.

In an illustrative procedure for fabricating a power MOSFET of the present invention, a blanket implant using phosphorus at a dosage of about $1\times10^{12}$ cm$^{-2}$ to about $5\times10^{13}$ cm$^{-2}$ at about 60 KeV to about 600 KeV is made in the substrate. A gate is formed on the substrate over the blanket implant, and first an N-well dopant and then a P-well dopant are implanted and driven into the substrate through the same window. The N-well and P-well are thus completely self-aligned. Phosphorus is employed as the dopant for the N-well, using a dosage of about $1\times10^{13}$ cm$^{-2}$ to about $5\times10^{14}$ cm$^{-2}$ implanted at about 40 KeV to about 120 KeV, followed by a 90-minute drive at a temperature of about 1100° C. Boron is used as the P-well dopant at a dosage of about $2\times10^{13}$ cm$^{-2}$ to about $8\times10^{14}$ cm$^{-2}$. The combination of the N-well and blanket implants results in a more highly doped neck region.

In a low-voltage/high power MOSFET, where the substrate resistance is predetermined by the silicon wafer, the on-resistance of the channel, highly doped neck, and substrate contribute the most to total device specific on-resistance. Thus, in designing a MOSFET, particular attention is paid to minimizing the resistance of the neck region and channel. The neck resistance can be decreased by using a high dose blanket implant and a wider neck. This approach would, however, lead to lower breakdown voltage and location of the breakdown close to the silicon-oxide interface, resulting in poor reliability and low UIS capability. Eliminating the blanket implant from the process of forming a low-voltage ($\leq$30V) DMOS device would increase the minimum on-resistance that the device can achieve.

Figure 3:
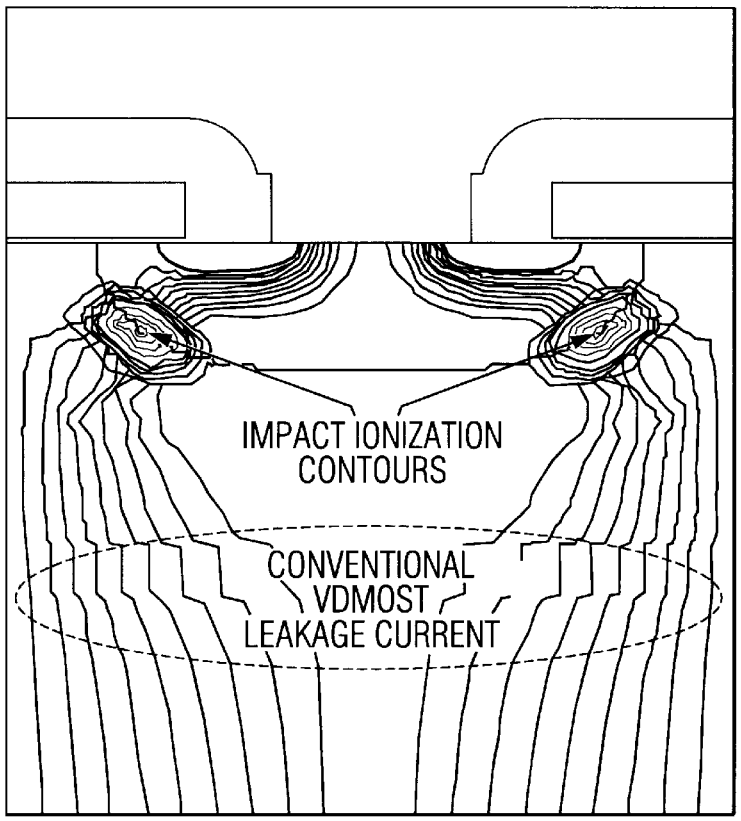
FIG. 3 is an illustration of the simulated leakage current for a vertical doubly diffused MOS transistor (VDMOST) of the prior art.
Figure 4:
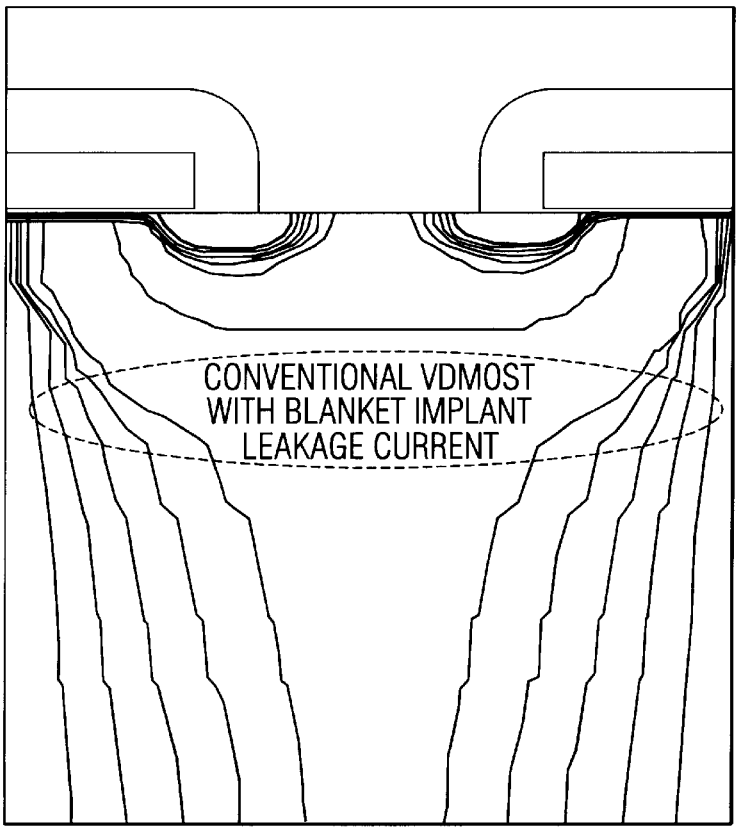
FIG. 4 is an illustration of the simulated leakage current for a prior art VDMOST having a blanket implant.

FIG. 3 depicts the avalanche leakage current of a prior art power MOSFET, designated C-1 in TABLE 1, using the best practice of the trade-off between device on-resistance and UIS capability. The simulated leakage current of a prior art power MOSFET that includes a phosphorus blanket implant, C-2 in TABLE 1, shows the breakdown location shifting to the Si/SiO$_2$ interface, as depicted in FIG. 4, which suggests that this device would have low UIS capability and poor reliability. Because the avalanche current of the device flows laterally through the P-well beneath the N+ source, an ohmic voltage drop is created across the lateral resistance of the P-well in addition to the contact resistance between the metal and the P-well. If this developed voltage approaches the built-in potential of the N+ source/P-well junction, the parasitic bipolar junction transistor (BJT) is turned on, which generally results in device failure. This malfunction is commonly referred to as UIS failure.

From FIG. 4 it can be seen that, if the breakdown location moves to the Si/SiO$_2$ interface, the path of the avalanche current flow becomes longer, and the cross-sectional area of the flow path becomes smaller as compared with that shown in FIG. 3. As a consequence, the ohmic voltage drop caused by the lateral current inside the P-well is higher during avalanche breakdown, and the parasitic BJT is turned on at lower avalanche current, resulting in lower UIS capability. In addition, the shift of the breakdown to the Si/SiO$_2$ interface increases the electric field at the interface, thereby reducing the device breakdown voltage. It also causes an accumulation of holes at the interface after initiation of the avalanche breakdown. Either of these effects is damaging to device reliability.

Figure 5:
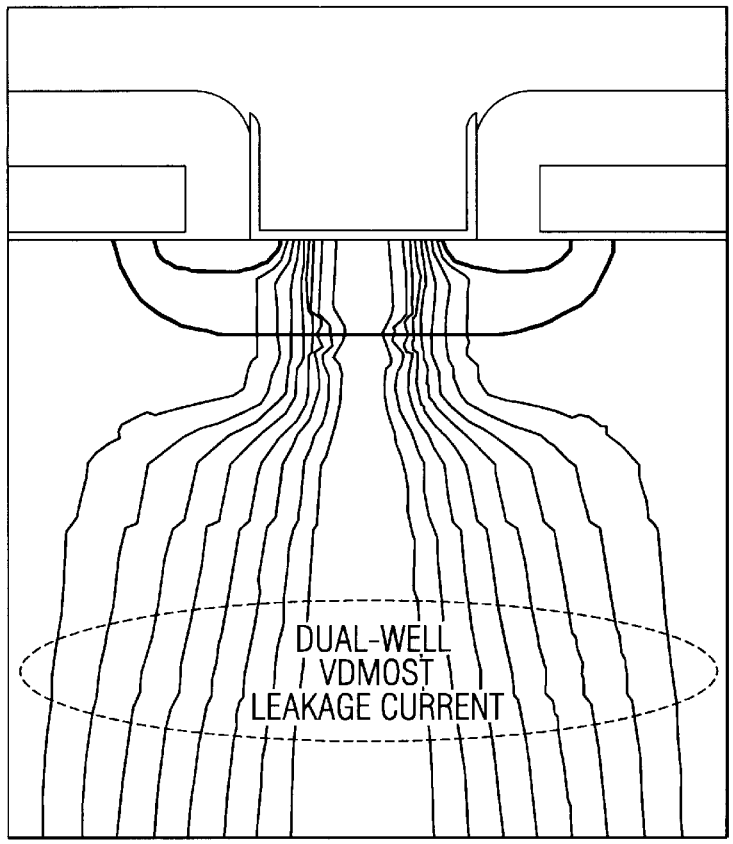
FIGS. 5 and 6 depict the simulated leakage current for two embodiments of dual-well devices of the present invention.

The location of breakdown of a device 100 of the present invention can be moved towards the middle flat portion of P-well 109 by a suitable choice of the dose and implant energy of N-well 108. The 1-D dopant distribution of N-well 108 under the flat portion of P-well 109 and the 2-D (stripe-type layout) or 3-D (hex-type layout) distribution of the N-well dopant at the curved portion of the N-well/P-well junction results in higher charge density in the flat portion of N-well 108 than in its curved portion near neck region 111. As a result, the device breakdown occurs at the flat portion, as shown in FIG. 5, which represents the computer simulated leakage current for a dual-well device of the present invention, designated I-4 in TABLE 1.

Figure 6:
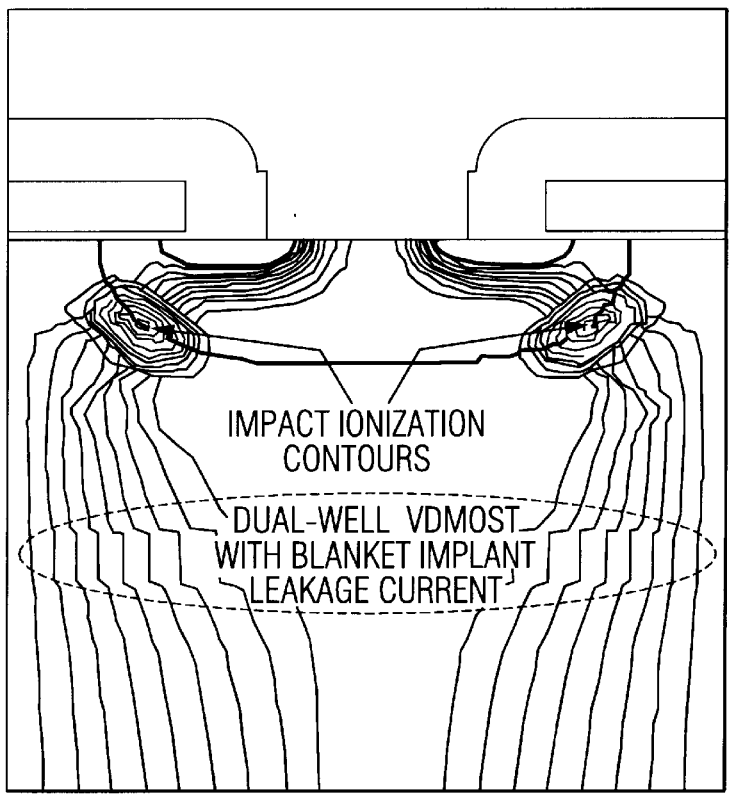

As shown in FIG. 4, a blanket implant in combination with the neck resistance of a prior art power MOSFET tends to move the device breakdown location upwards. This effect is counteracted by a tendency toward downward movement promoted by inclusion of an N-well, which enables further optimization. This is illustrated by the computer simulation results shown in FIG. 6 for a device of the invention, I-5 in TABLE 1, which has a a higher dose blanket implant than device I-4. A comparison of FIGS. 6 and 3 show that the breakdown location is almost identical for devices of the invention I-5 and prior art device C-1, which includes no blanket implant.

Another beneficial effect of introducing the N-well is an increase in forward current spreading angle and efficiency because of the lower resistive path conforming to the N-well/P-well junction. As a result, the dual N-well/P-well combination can produce substantially lowered on-resistance without degrading device ruggedness and reliability.

A detailed comparison of devices of the prior art and of the present invention is provided in TABLE 1, which includes entries for blanket and well implant, threshold voltage ($V_{th}$), short channel effect (SCE), breakdown voltage ($V_{br}$), and specific on-resistance ($R_{sp}$) values and improvement, as well as UIS capability. As shown in TABLE 1, the breakdown voltage of device C-1 is 31.88V, and its specific on-resistance is 1.26 mΩ.cm$^2$ at a gate voltage of 4.5V. For device C-2, which includes a blanket implant, the breakdown voltage of prior art device C-2 is 29.85V, and its specific on-resistance at 4.5V gate bias is 1.02 mΩ.cm$^2$. A comparison of the results from devices C-1 and C-2 shows that only about a 20% reduction in on-resistance is achieved at a sacrifice of device reliability and ruggedness.

TABLE 1

| MOS | Blanket P implant | N-WELL P implant | P-WELL B implant | $V_{th}$ (V) | $V_{br}$ (V) | $R_{sp}$ (m Ω · cm$^2$) @ gate bias, (V) 4.5 | 5.0 | 10.0 | $R_{sp}$ improvement @ 4.5 V gate bias | UIS |
|---|---|---|---|---|---|---|---|---|---|---|
| C-1 | None | None | $8 \times 10^{13}$ @ KeV Drive: 54 min Cool: 100 min | 1.68 SCE: 34% | 31.88 | 1.26 | 1.14 | 0.78 | 0 (ref) | Good |
| C-2 | $2 \times 10^{12}$ @ 120 KeV | None | $8 \times 10^{13}$ @ 60 KeV Drive 54 min Cool: 300 min | 1.49 SCE: 68% | 29.85 | 1.02 | 0.89 | 0.58 | 19% | Poor |

TABLE 1-continued

| MOS | Blanket P implant | N-WELL P implant | P-WELL B implant | $V_{th}$ (V) | $V_{br}$ (V) | $R_{sp}$ (m Ω · cm²) @ gate bias, (V) | | | $R_{sp}$ improvement @ 4.5 V gate bias | UIS |
|---|---|---|---|---|---|---|---|---|---|---|
| | | | | | | 4.5 | 5.0 | 10.0 | | |
| I-1 | $1 \times 10^{12}$ @ 120 KeV | $1 \times 10^{13}$ @ 60 KeV Drive: 54 min Cool: 100 min | $8 \times 10^{13}$ @ 60 KeV Drive: 54 min Cool: 100 min | 1.21 SCE: 199% | 29.06 | 0.70 | 0.65 | 0.48 | 44% | Good |
| I-2 | $1 \times 10^{12}$ @ 120 KeV | $1 \times 10^{13}$ @ 60 KeV Drive: 90 min Cool: 100 min | $8 \times 10^{13}$ @ KeV Drive: 90 min Cool: 100 min | 1.46 SCE: 49% | 30.63 | 0.74 | 0.68 | 0.49 | 41% | Good |
| I-3 | $1 \times 10^{12}$ @ 120 KeV | $8 \times 10^{12}$ @ 60 KeV Drive: 90 min Cool: 100 min | $8 \times 10^{13}$ @ 60 KeV Drive: 90 min Cool: 100 min | 1.51 SCE: 39% | 31.05 | 0.76 | 0.70 | 0.51 | 40% | Good |
| I-4 | $1 \times 10^{12}$ @ 80 KeV | $6 \times 10^{12}$ @ 60 KeV Drive: 90 min Cool: 100 min | $8 \times 10^{13}$ @ 60 KeV Drive: 90 min Cool: 100 min | 1.56 SCE: 31% | 31.27 | 0.77 | 0.71 | 0.51 | 39% | Good |
| I-5 | $2 \times 10^{12}$ @ 120 KeV | $8 \times 10^{12}$ @ 60 KeV Drive: 90 min Cool: 100 min | $8 \times 10^{13}$ @ 60 KeV Drive: 90 min Cool: 100 min | 1.42 SCE: 62% | 30.14 | 0.71 | 0.65 | 0.48 | 43% | Good |
| I-6 | $2 \times 10^{12}$ @ 120 KeV | $6 \times 10^{12}$ @ 60 KeV Drive: 90 min Cool: 100 min | $8 \times 10^{13}$ @ 60 KeV Drive: 90 min Cool: 100 min | 1.48 SCE: 49% | 30.55 | 0.73 | 0.67 | 0.49 | 42% | Good |

Figure 7:
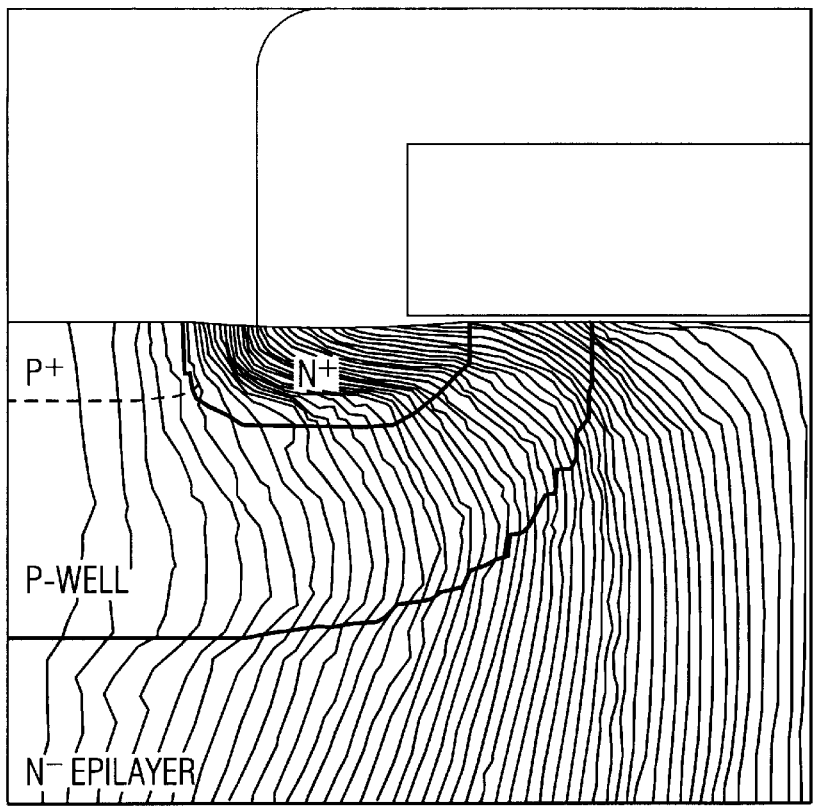
FIG. 7 illustrates the current flowlines during forward conduction of the body diode in a prior art device.
Figure 8:
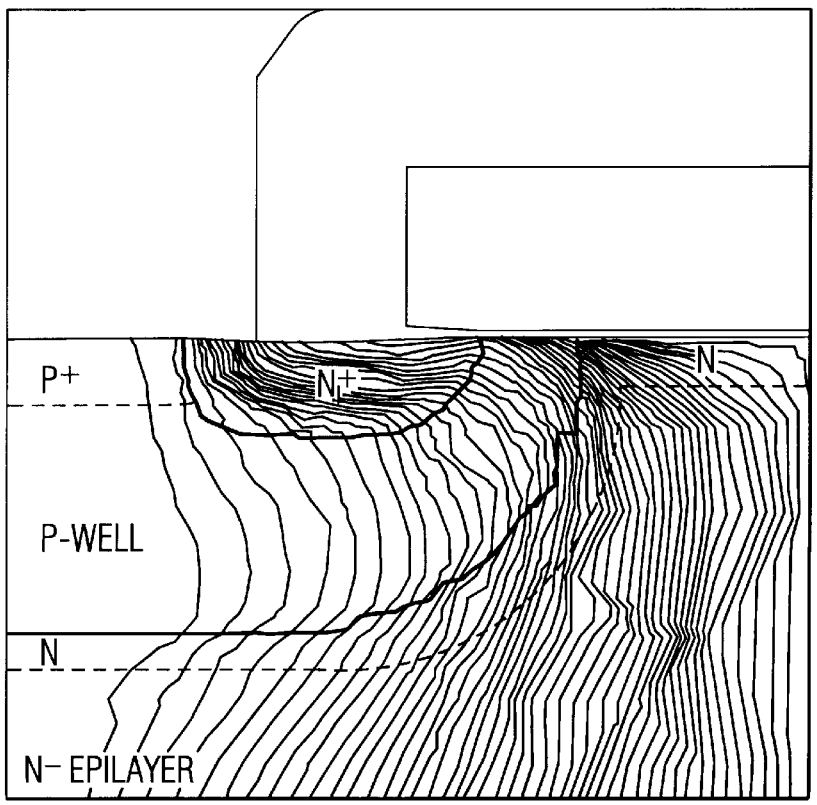
FIG. 8 illustrates the current flowlines during forward conduction of the body diode in a dual-well device of the present invention.
Figure 9:
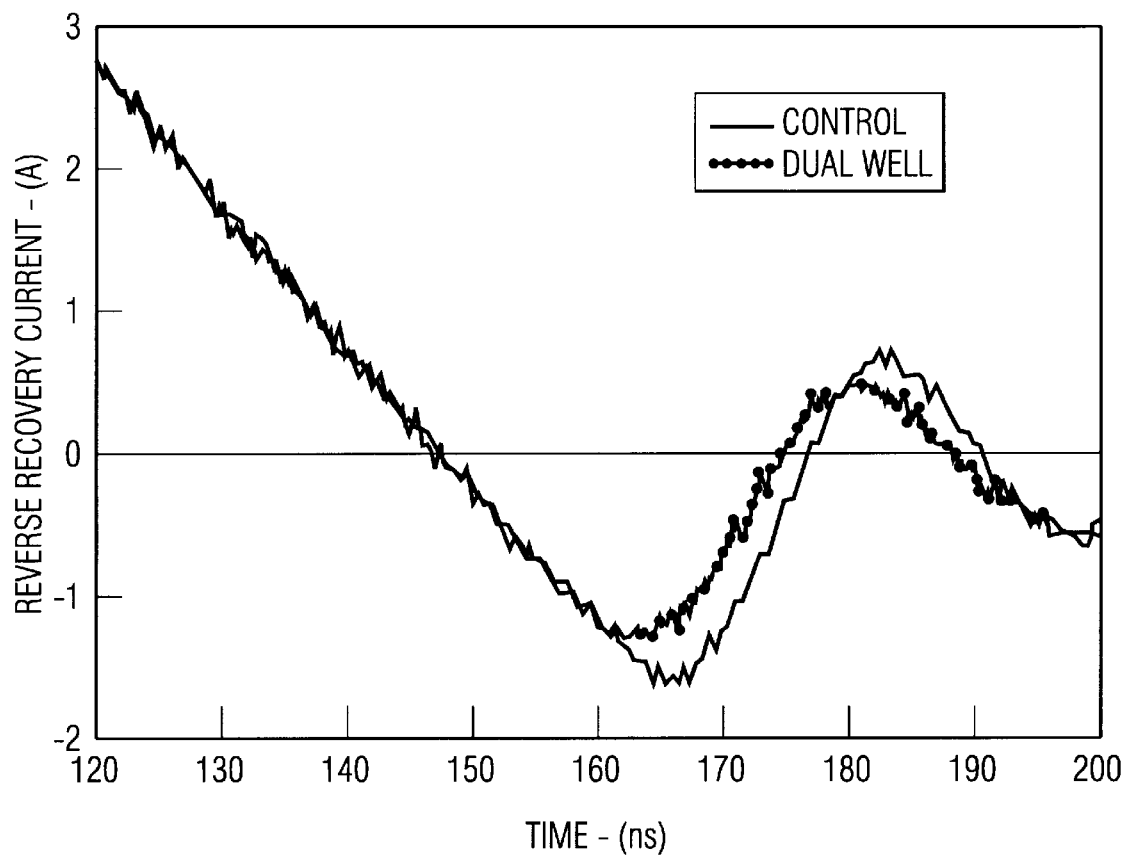
FIG. 9 is the measured plot of reverse recovery current versus time for a prior art device compared with a dual-well device of the present invention.

As shown in TABLE 1, a simulation for device I-5 of the present invention yields a specific on-resistance of 0.71 mΩ.cm² at 4.5 V gate bias, which, compared with a corresponding value of 1.26 mΩ.cm² for prior art device C-1, represents an improvement in specific on-resistance of almost 44%. Furthermore, during the forward conduction (third quadrant operation) of the device body diode formed by the P-well and the N-epitaxial layer, the N-well also reduces the hole injection from the P-well into the N-epitaxial layer and increases the electron injection from the N-well into the P-well. As a consequence, the function of the parasitic BJT, which is formed by the N+source, the P-well, and the N-well/N-epitaxial layer junction is enhanced. This is verified by the computer simulation results in FIGS. 7 and 8, which depict the forward conduction flowlines, at a source-drain current of 10 amps, for devices C-1 and I-5 of, respectively, the prior art and the present invention. For prior art device C-1, FIG. 7 shows that 88% of the total current is collected by the N+ source, leaving 12% to flow through the body contact. By comparison, for the dual-well device I-5 of the present invention, FIG. 8 shows that 96% of the total current is collected by the N+ source, leaving 4% to flow through the body contact. The enhancement of the parasitic BJT operation increases the electron diffusion current in the P-well and reduces the stored minority charges in the N-epitaxial layer and the P-well. In addition, the lowered reverse recovery charge of the body diode of the dual-well device of the present invention is accompanied by a slight decrease in the forward voltage drop of the body diode, which is demonstrated by the reverse recovery characteristics measurement shown in FIG. 9 for devices C-1 and I-5.

The other devices of the present invention, I-1, I-2, I-3, I-4, and I-6, in which the blanket and N-well doping conditions are varied as shown in TABLE 1, also show improvements in specific on-resistance similar to that observed for device I-5.

The present invention thus provides a low voltage DMOS device whose specific on-resistance can be greatly lowered and whose body diode reverse recovery characteristics to be improved even while allowing its ruggedness and reliability to be maintained.

The invention has been described in detail for the purpose of illustration, but it is understood that such detail is solely for that purpose, and variations can be made therein by those skilled in the art without departing from the spirit and scope of the invention, which is defined by the following claims.

What is claimed:

1. An improved low-voltage MOS device having high ruggedness, low on-resistance, and improved body diode reverse recovery characteristics, said device comprising:

a semiconductor substrate:

a doped upper layer of a first conduction type disposed on said substrate, said upper layer comprising a blanket implant of said first conduction type, a heavily doped source region of said first conduction type, and a heavily doped body region of a second and opposite conduction type disposed at an upper surface of said upper layer, said upper layer further comprising a doped first well region of said first conduction type and a doped second well region of a second conduction type underlying said source and body regions, said first well region underlying said second well region and merging with said blanket implant, thereby forming a highly doped neck region abutting said second well region at said upper surface of said upper layer; and a gate overlying said highly doped neck region, said gate comprising a conductive material separated from said upper layer by an insulating layer.

2. The MOS device of claim 1 wherein said doped upper layer comprises an epitaxial layer.

3. The MOS device of claim 1 wherein said first conduction type is N and said second conduction type is P.

4. The MOS device of claim 1 wherein said substrate comprises monocrystalline silicon and said insulating layer comprises silicon dioxide.

5. The MOS device of claim 1 wherein said conductive material included in said gate comprises highly doped polysilicon.

6. The MOS device of claim 1 further comprising a source metal contact and an interlevel dielectric layer.

* * * * *